United States Patent [19]
Choi et al.

[11] Patent Number: 6,121,072
[45] Date of Patent: Sep. 19, 2000

[54] METHOD OF FABRICATING NONVOLATILE MEMORY DEVICE

[75] Inventors: Woong-Lim Choi; Kyeong-Man Ra, both of Chungcheongbuk-do, Rep. of Korea

[73] Assignee: LG Semicon Co., Ltd., Chungcheongbuk-Do, Rep. of Korea

[21] Appl. No.: 09/035,128

[22] Filed: Mar. 5, 1998

[30] Foreign Application Priority Data

Jul. 9, 1997 [KR] Rep. of Korea ............... 97-31840

[51] Int. Cl.[7] ............................................. H01L 21/8247
[52] U.S. Cl. ......................... 438/129; 438/264; 438/265
[58] Field of Search ............................. 438/257, 264, 438/265, FOR 212, FOR 203, FOR 208, 129

[56] References Cited

U.S. PATENT DOCUMENTS 4,267,632  5/1981  Shappir .
5,707,897  1/1998  Lee et al. .

OTHER PUBLICATIONS

Hitoshi Kume, et al., "A 1.28 $\mu m^2$ Contactless Memory Cell Technology for a 3V–Only 64 Mbit EEPROM"; International Electron Devices meeting 1992, Technical Digest; pp. 24.7.1–27.7.3; Dec. 13–16, 1992.

Primary Examiner—George Fourson
Attorney, Agent, or Firm—Morgan, Lewis & Bockius LLP

[57] ABSTRACT

A method of fabricating a nonvolatile memory device having a substrate, includes the steps of forming a plurality of bit lines in the substrate, forming a plurality of field oxide layers on the substrate perpendicular to the bit lines, forming a gate insulating layer on an entire surface of the substrate including the bit lines and the field oxide layers, forming a plurality of floating lines on the gate insulating layer between the bit lines, forming a dielectric layer on the entire surface of the semiconductor substrate including the floating line's and the gate insulating layer, forming a plurality of word lines between the field oxide layer perpendicular to the bit lines, forming sidewall spacer at both sides of the word lines, selectively removing the dielectric layer and the floating lines using the word lines and the sidewall spacer as masks to form a plurality of floating gates, forming a tunneling layer at both sides of the floating gates, and forming a plurality of program lines between the bit lines.

33 Claims, 13 Drawing Sheets

METHOD OF FABRICATING NONVOLATILE MEMORY DEVICE

This application claims the benefit of Korean Application No. 31840/1997 filed on Jul. 9, 1997, which is hereby incorporated by reference.

BACKGROUND OF THE INVENTION

1. Field of the Invention

The present invention relates to a semiconductor device, and more particularly, to a method of fabricating a nonvolatile memory device. Although the present application is suitable for a wide scope of applications, it is particularly suitable for minimizing an effective size of a nonvolatile memory device.

2. Discussion of the Related Art

Generally, a memory cell determines packing density of a nonvolatile memory devices such as electrically erasable programmable read only memory (EEPROM) and flash EEPROM. Effective size of such a memory cell is determined by size and array of the cell. For example, the memory cell has a minimum cell structure using a simple stacked-gate structure.

Recently, as demand in the nonvolatile memory such as flash EEPROM and a flash memory card has been increased, the nonvolatile memory has been actively researched throughout the industry.

Nonetheless, when the nonvolatile semiconductor memory devices is applied for mass storage media, there is an obstacle yet to be overcome. For example, cost per bit in the nonvolatile semiconductor memory is still too expensive. Furthermore, a low power consuming memory chip is required for application to portable electronics. As a result, to reduce the cost per bit in the nonvolatile memory device, a multi-bit cell has been studied recently.

Since the conventional nonvolatile memory stores only one bit data in one memory cell, its packing density has a one-to-one relationship with the number of the memory cell. On the other hand, a multi-bit cell has a high packing density without reducing the size of the memory cell since two or more bit data are stored in one memory cell.

To realize such a multi-bit per cell, three or more threshold voltage levels should be programmed in the respective memory cell. For example, to store two bit data per cell in a memory cell, four threshold voltage levels ($2^2$=4) should be programmed. At this time, four threshold voltage levels are logic values 00, 01, 10, and 11, respectively.

However, even in the multi-level programming, there is a problem that a respective threshold voltage level has a distribution value of about 0.5V.

Since such a distribution value is reduced by exactly adjusting the respective threshold voltage levels, it is possible to program more threshold voltage levels, thereby increasing the number of bits per cell. To reduce such a voltage level, a method of repeatedly performing programming and monitoring has been adopted.

In such a method, to program the nonvolatile memory cell at a desired threshold voltage level, a series of program voltage pulses are applied to the cell. To monitor whether the cell has reached a desired threshold voltage level, the threshold voltage of the programmed memory cell is read. In the course of monitoring, programming is completed if the monitored threshold voltage level reaches a desired threshold voltage level value.

However, in repeatedly performing programming and monitoring, it is difficult to reduce an error distribution of threshold voltage level due to a limited program voltage pulse width. Moreover, since the algorithm for repeatedly performing programming and monitoring is realized by means of circuits, problems arise where an area of a peripheral circuit for the memory chip increases and programming time takes longer.

FIGS. 1A and 1B are a cross-sectional view and a circuit diagram illustrating a conventional simple stacked nonvolatile memory device, respectively.

As shown in FIG. 1, a floating gate 3 is formed over a p-type semiconductor substrate 1. A tunneling oxide film 2 is formed between the floating gate 3 and the p-type semiconductor substrate 1. A control gate 5 is formed over the floating gate 3. A dielectric film 4 is formed between the control gate 5 and the floating gate 3. An n-type source region 6a and an n-type drain region 6b are formed in the p-type semiconductor substrate 1 at both sides of the floating gate 3.

In the conventional simple-stacked nonvolatile memory cell, a coupling coefficient becomes smaller as the effective cell size of the nonvolatile memory cell is reduced. To solve such a problem, the dielectric film 4 may be formed using oxide-nitride-oxide (ONO) structure. However, this structure causes complicated process steps and also requires a high temperature annealing process.

Meanwhile, as shown in FIG. 1B, the nonvolatile memory cell includes a floating gate 3, a control gate 5 for controlling the charge amount provided to the floating gate 3 for programming, and a field effect transistor for reading (or monitoring) the charge amount provided to the floating gate 3 during programming. The field effect transistor includes a floating gate 3, a source 6a, a drain 6b, and a channel region 7 between the source 6a and the drain 6b.

The aforementioned nonvolatile memory cell is operated when a current flows between the drain 6b and the source 6a if a sufficient voltage for programming is applied to the control gate 5 and the drain 6b.

Then, the current is compared with a reference current. If it is the same as or less than the reference current, a programming completion signal is generated and the programming is completed.

The conventional nonvolatile memory device will be described with reference to the accompanying drawings.

FIG. 2A is a circuit illustrating a conventional nonvolatile memory device. FIG. 2B is a circuit illustrating another conventional nonvolatile memory device having a simple stacked structure without metal contact. FIG. 2C is a circuit illustrating another conventional nonvolatile memory device having no metal contact, in which a source and a drain are separated from each other.

As shown in FIG. 2A, a plurality of metal bit lines 9 are disposed in a column direction at a predetermined interval. A plurality of word lines 10 are disposed in a direction perpendicular to the metal bit lines 9. A common source line 11 per two word lines 10 is disposed in the same direction as the word lines 10.

The drains 6b of a pair of cells in the nonvolatile memory device are connected to the metal bit lines 9 and the sources 6a are connected to the common source line 11. Since a metal contact 8 per two cells is required, the effective size of the memory cell becomes significantly large. Therefore, although the conventional nonvolatile memory cell array has a minimum cell size of a simple stacked structure, the effective cell size is substantially limited by the pitch of the metal contact 8.

To solve such a problem, a nonvolatile memory cell array without metal contact 8 has been proposed to reduce the number of the overall metal contacts. In other words, the nonvolatile memory cell array having a simple stacked cell structure without metal contact can provide with a minimum effective cell size.

However, in the nonvolatile memory cell array having no metal contact, a programming disturbance occurs during programming or erasing a non-selected cell adjacent to the word line direction.

Thus, instead of the nonvolatile memory cell array having no metal contact, a nonvolatile memory cell array having an asymmetrical split-channel cell structure including a selection gate 12 has been used to solve such a problem, as shown in FIG. 2B. In this case, the programming disturbance can be avoided during programming due to hot electron injection and also over-erasing can be eliminated.

As shown in FIG. 2B, the nonvolatile memory device includes a plurality of word lines 10 disposed on a semiconductor substrate (not shown) at a predetermined interval, a plurality of bit lines 13 perpendicular to the word lines 10 to form a plurality of squares at a predetermined interval, and a plurality of memory cells disposed one by one in respective squares.

The respective nonvolatile memory cell of FIG. 2B includes a floating gate 3, a control gate 5 for controlling the amount of charge provided to the floating gate 3 for programming, and a field effect transistor for reading or monitoring the charge amount provided to the floating gate 3 during programming.

Specifically, the field effect transistor includes a floating gate 3, a source 6a, a drain 6b, and a channel region 7 between the source 6a and the drain 6b.

The control gate 5 of the respective nonvolatile memory cell is coupled to the adjacent word line 10. The source 6a of the nonvolatile memory cell in one square is coupled to the adjacent bit line 13 in common with the drain 6b of the nonvolatile memory cell in the next square.

Also, a selection transistor 12 is coupled to the bit line 13. A metal contact 8 per thirty-two nonvolatile memory cells or more is connected to the selection transistor 12 in a column direction. Thus, effective cell size can be reduced. However, in this case, there is a problem that the size in unit cell increases due to a gate of the selection transistor. Particularly, it is difficult to perform programming by tunneling of low power operation. The reason why is that two cells adjacent to the word line direction are subject to the same bias condition as each other, as easily recognized by the drawing.

To solve such a problem and to enable tunneling programming, the nonvolatile memory device having no metal contact, in which a source and a drain are separated from each other, has been proposed, as shown in FIG. 2C.

In such a nonvolatile memory device, a plurality of metal data lines 9 are disposed in a column direction at a predetermined interval. A plurality of bit lines separated by a source line 15 and a drain line 14 are disposed in the same direction as the metal data lines 9.

The source 6a of the nonvolatile memory cell of FIG. 1B is coupled to the source bit line 15 and its drain 6b is coupled to the drain bit line 14.

A metal contact 8 is connected to the respective metal data line 9. The control gate 5 is connected to the respective word lines 10 in a direction perpendicular to the bit line separated by the source bit line 15 and the drain bit line 14. However, in the aforementioned structure, there is a problem in that the size in unit cell increases due to a separation of the bit lines.

FIG. 3 is a cross-sectional view illustrating a conventional nonvolatile memory device having a split-channel cell structure with a split-gate.

As shown in FIG. 3, a floating gate 3 is formed over a P type semiconductor substrate 1. A tunneling oxide film 2 is formed between the floating gate 3 and the P type semiconductor substrate 1. A control gate 5 is formed over the floating gate 3. An insulating film 16 is formed over the P type semiconductor substrate 1 including the control gate 5 and the floating gate 3. A selection gate 17 is formed on the insulating film 16. A dielectric film 4 is formed between the control gate 5 and the floating gate 3. A source 6a is formed in the P type semiconductor substrate 1 at one side of the floating gate 3 to be offset with respect to the floating gate 3. A drain 6b is formed in the P type semiconductor substrate 1 at the other side of the floating gate 3.

FIG. 4A is a cross-sectional view illustrating a conventional nonvolatile memory device having a split-channel cell structure. FIG. 4B is a cross-sectional view illustrating a conventional nonvolatile memory device of FIG. 4A in a channel width direction.

In the conventional nonvolatile memory device having a split-channel cell structure, as shown in FIG. 4A, a floating gate 3 is formed over a P type semiconductor substrate 1 at a predetermined interval. A control gate 5 is formed over the floating gate 3. Subsequently, a tunneling oxide film 2 is formed between the floating gate 3 and the P type semiconductor substrate 1. A dielectric film 4 is formed between the floating gate 3 and the control gate 5.

A source 6a is formed in the P type semiconductor substrate 1 at one side of the floating gate 3 to be offset with the floating gate 3. A drain 6b is formed in the P type semiconductor substrate 1 at the other side of the floating gate 3.

In the nonvolatile memory device shown in a channel width direction, as shown in FIG. 4B, a field oxide film 18 for insulation between cells is formed on the P type semiconductor substrate 1 at a predetermined interval. A gate insulating film 19 is formed on the P type semiconductor substrate 1 between the respective field oxide films 18.

A floating gate 3 is formed on the gate insulating film 19 to overlap the adjacent field oxide film 18. A dielectric film 4 is formed on a predetermined region of the floating gate 3. A control gate 5 is formed on the dielectric film 4.

A gate cap insulating film 20 is formed on the control gate 5. An insulating film sidewall spacer 21 is formed at both sides of the gate cap insulating film 20 and the control gate 5. An erasing gate 17 is formed on the field oxide film 18 and the gate cap insulating film 20. A tunneling oxide film 22 is formed respectively at both sides of the floating gate 3 and the adjacent erasing gate 17.

However, the aforementioned conventional nonvolatile memory device has a problem in that although the memory cell array of a simple stacked cell structure having no metal contact may provide a minimum effective cell size, it also causes undesired program disturbances.

SUMMARY OF THE INVENTION

Accordingly, the present invention is directed to a method of fabricating a nonvolatile memory device that substantially obviate one or more of the problems due to limitations and disadvantages of the related art.

Another object of the present invention is to provide a method of fabricating a nonvolatile memory device having a minimum effective cell size without program disturbance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a nonvolatile memory device according to the present invention includes the steps of preparing a first conductivity type semiconductor substrate, forming a plurality of bit lines in the semiconductor substrate in one direction at a predetermined interval, forming a plurality of field oxide films in a direction perpendicular to the bit lines at a predetermined interval, forming a gate insulating film on an entire surface of the semiconductor substrate, forming a plurality of floating lines having a predetermined interval on the gate insulating film between the respective bit line in the same direction as the bit lines, forming a dielectric film on the entire surface of the semiconductor substrate including the floating lines, sequentially forming a conductive layer and an insulating film on the dielectric film and selectively removing them to form a plurality of word lines between the respective field oxide films to be perpendicular to the respective bit lines, forming an insulating film sidewall spacer at both sides of the respective word line, selectively removing the dielectric film and the floating lines using the word lines and the insulating film sidewall spacer as masks to form a plurality of floating gates, forming a tunneling oxide film at both sides of the respective floating gates, and forming a plurality of program lines between the respective bit lines to be in contact with the tunneling oxide film.

In another aspect of the present invention, a method of fabricating a nonvolatile memory device having a substrate includes the steps of forming a plurality of bit lines in the substrate, forming a plurality of field oxide layers on the substrate substantially perpendicular to the bit lines, forming a gate insulating layer over surface of the substrate including the bit lines and the field oxide layers, forming a plurality of floating lines on the gate insulating layer between the bit lines, forming a dielectric layer over the surface of the semiconductor substrate including the floating lines and the gate insulating layer, forming a plurality of word lines between the field oxide layer substantially perpendicular to the bit lines, forming sidewall spacer at both sides of the word lines, selectively removing the dielectric layer and the floating lines using the word lines and the sidewall spacer as masks to form a plurality of floating gates, forming a tunneling layer at both sides of the floating gates, and forming a plurality of program lines between the bit lines.

In a further aspect of the invention, the method of fabricating a nonvolatile memory device having a substrate includes the step of forming a mask layer to define a bit line region on the substrate, forming a high temperature low deposition (HLD) spacer at both sides of the mask layer, implanting impurities into the substrate using the mask layer and the HLD spacer as masks to form a plurality of bit lines, forming a plurality of field oxide layers on the substrate substantially perpendicular to the bit lines, forming a gate insulating layer on a surface of the substrate including the bit lines and the field oxide layers, forming a plurality of floating lines on the gate insulating layer between the bit lines, forming a dielectric layer on the surface of the semiconductor substrate including the floating lines and the gate insulating layer, forming a conductive layer on the dielectric layer, forming an insulating layer on the conductive layer, selectively removing the conductive layer and the insulating layer to form a plurality of word lines, forming a sidewall spacer at both sides of the word lines, selectively removing the dielectric layer and the floating lines using the word lines and the sidewall spacer as masks to form a plurality of floating gates, forming an oxide layer on the field oxide layer, performing an etching process on the oxide layer, and forming a plurality of program lines between the bit lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a cart of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
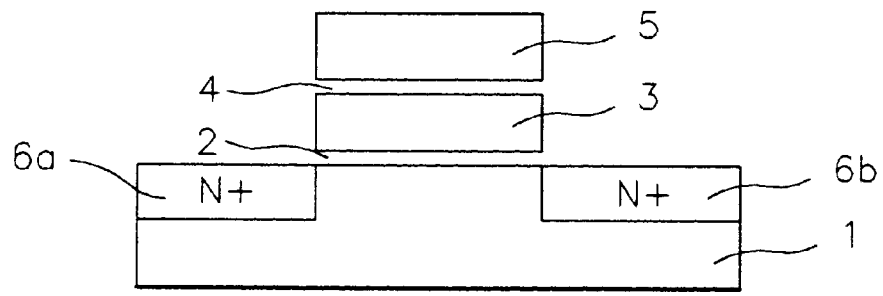
FIG. 1A is a cross-sectional view illustrating a conventional simple stacked nonvolatile memory device.
Figure 1B:
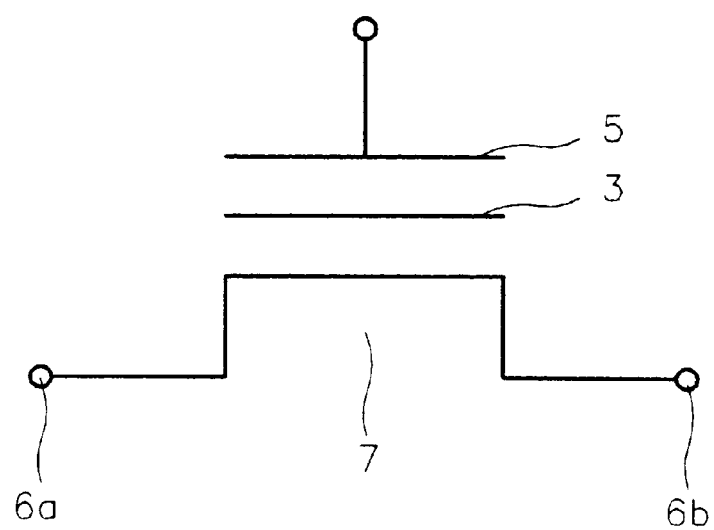
FIG. 1B is a schematic diagram of a conventional nonvolatile memory cell.
Figure 2A:
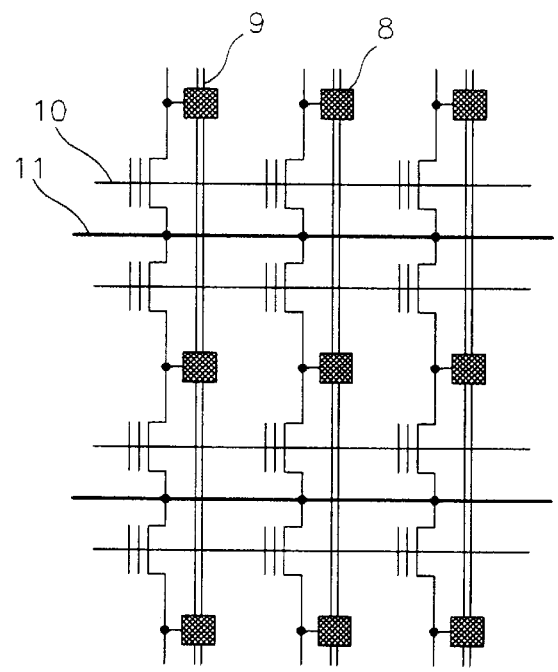
FIG. 2A is a circuit diagram illustrating a conventional nonvolatile memory device with metal contact.
Figure 2B:
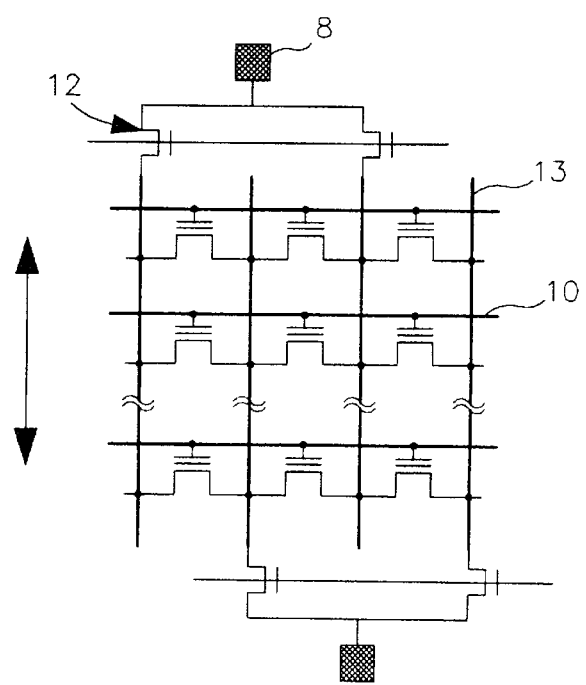
FIG. 2B is a circuit diagram illustrating a conventional nonvolatile memory device having a simple stacked structure without metal contact.
Figure 2C:
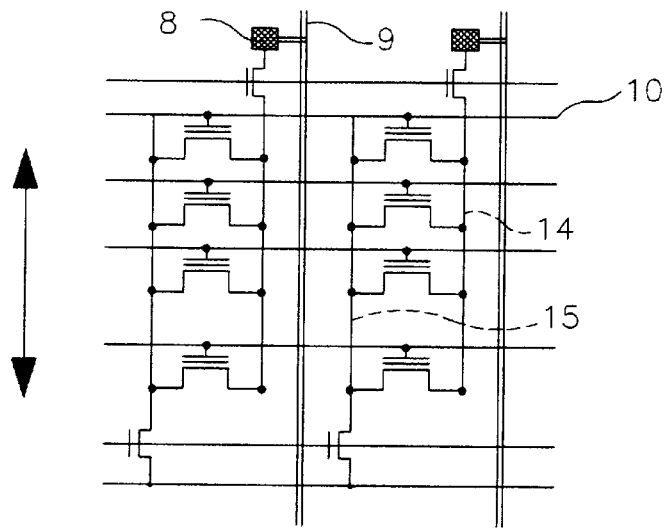
FIG. 2C is a circuit illustrating a conventional nonvolatile memory device having a structure without metal contact, and a source and a drain separated from each other.
Figure 3:
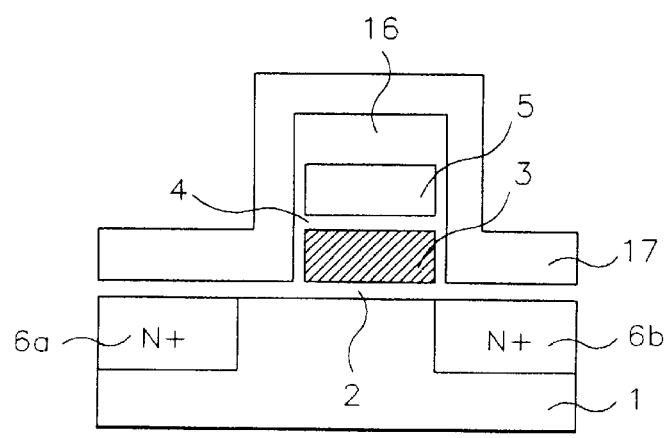
FIG. 3 is a cross-sectional view illustrating a conventional nonvolatile memory device having a split-channel cell structure with a split-gate structure.
Figure 4A:
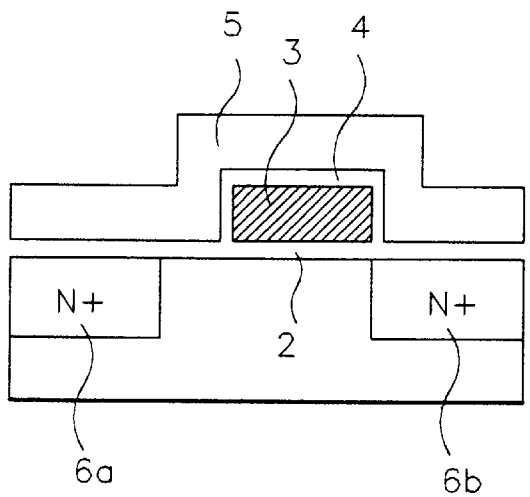
FIG. 4A is a cross-sectional view illustrating a conventional nonvolatile memory device having a split-channel cell structure without a split-gate structure.
Figure 4B:
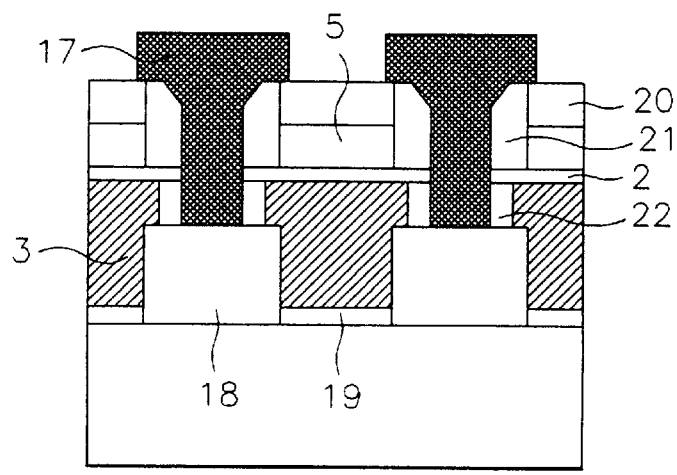
FIG. 4B is a cross-sectional view illustrating a conventional nonvolatile memory device of FIG. 4A shown in a channel width direction.
Figure 5A:
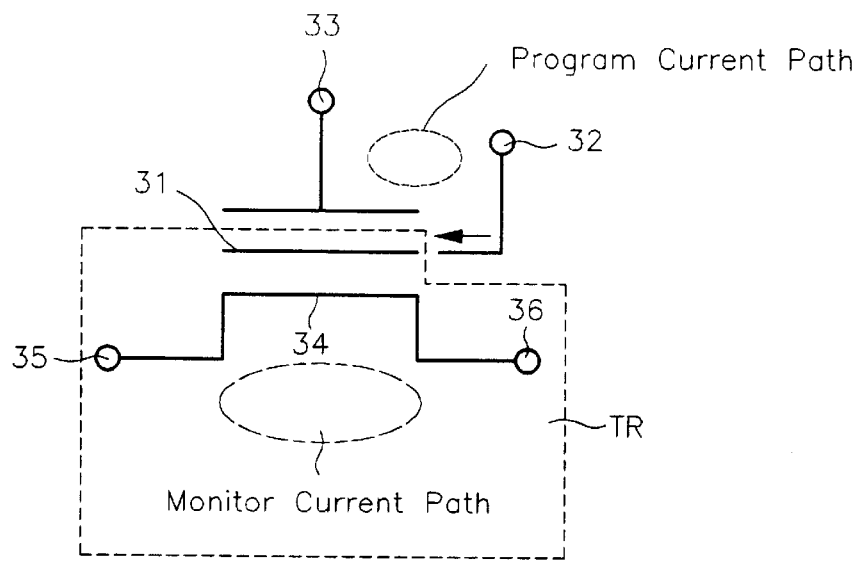
FIG. 5A is a schematic diagram illustrating a nonvolatile memory cell according to the present invention.

As shown in FIG. 5A, a nonvolatile memory cell according to the present invention includes a floating gate 31 for storing charges during programming, a program gate 32 for performing programming by implanting the charges externally provided during programming into the floating gate 31, a control gate 33 for controlling the charges provided to the floating gate 31 from the program gate 32, and a transistor TR, consisting of the floating gate 31, a channel region 34, a source 35 and a drain 36, for monitoring the charges provided from the program gate 32 during programming.

The nonvolatile memory cell having a split-channel cell structure according to the present invention separates a programming region from a channel region. In other words, a programming current path and a channel region are separated from each other during programming. Variation of conductivity in the channel region 34, corresponding to variation of the amount of charge in the floating gate 31, can be monitored during programming. Accordingly, programming and monitoring can be simultaneously performed.

The monitoring is performed by a field effect transistor consisting of the floating gate 31, the program gate 32, and the channel region 34. In monitoring, the drain current or the source current of the cell is monitored through a conventional sense amplifier (not shown). In the nonvolatile memory cell according to the present invention, the program current path and the monitoring current path are separated from each other.

The nonvolatile memory cell of the present invention includes a four-terminal field effect transistor consisting of the control gate 33, the source 35, the drain 36, and the program gate 32. In this respect, the present invention is different from the conventional nonvolatile memory cell having a three-terminal field effect transistor.

The nonvolatile memory cell of the present invention may simultaneously perform programming and monitoring. Alternatively, the nonvolatile memory cell may repeatedly perform programming and monitoring in turn. Operation of the nonvolatile memory cell according to the present invention will now be described as follows.

In an n-type transistor, erasing operation of the nonvolatile memory cell is performed by implanting electrons into the floating gate 31. The erasing operation may be performed by tunneling from the channel region 34 or the drain region 36, or may be performed by hot electron implantation from the source 35. When the hot carrier implantation is used for the erasing operation, a gate dielectric disposed between the channel region 34 or the drain region 36 and the floating gate 31 does not have to be very thin for tunneling.

Since the gate dielectric has a coupling coefficient better than the conventional tunneling gate dielectric, low voltage and high speed operations is achieved in the present invention. This removes problems such as low field leakage current in the gate oxide film and degradation caused by downsizing the nonvolatile memory cell. In this respect, the nonvolatile memory cell of the present invention has an advantage that facilitates downsizing the cell size.

In the aforementioned nonvolatile memory cell of the present invention, programming or erasing can be performed on a cell array by independently selecting a cell. For example, in programming, the memory cell is selected by a transistor consisting of the control gate 33 and the drain 36.

In an n-type transistor, programming can be performed by tunneling, and erasing can be performed by the source side hot electron. Therefore, the nonvolatile memory cell of the present invention is suitable for both EEPROM and flash EEPROM.

Furthermore, if a sufficient voltage for programming is applied to the control gate 33 and the drain 36, current flows between the drain 36 and the source 35. This current is compared with a reference current. When the current has a value the same as or smaller than the reference current, a programming completion signal is generated to complete programming.

Figure 5B:
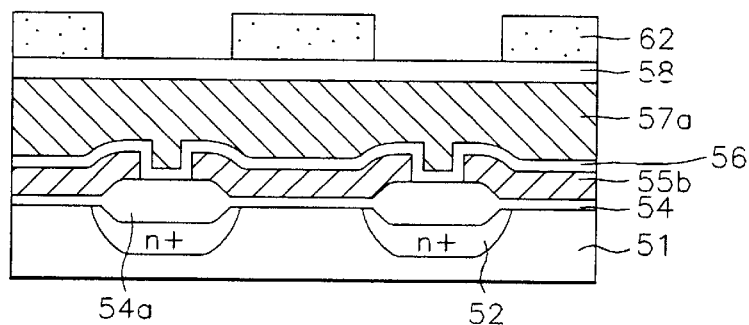
FIG. 5B is a cross-sectional view illustrating a nonvolatile memory device according to the present invention, shown in a channel direction.
Figure 5C:
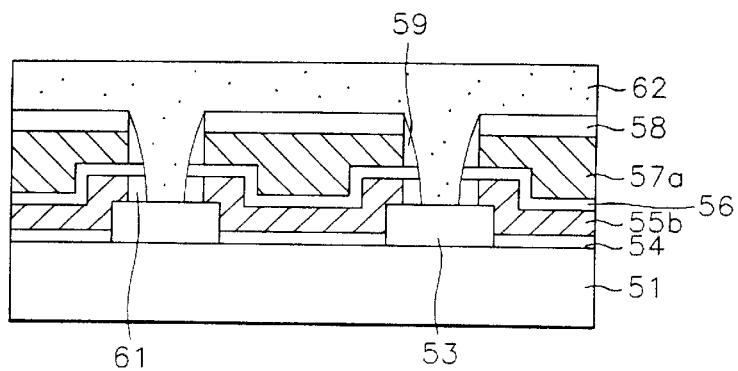
FIG. 5C is a cross-sectional view illustrating a nonvolatile memory device according to the present invention shown in a direction perpendicular to a channel.

As shown in FIG. 5B and FIG. 5C, a bit line 52 is formed in a p-type semiconductor substrate 51 in one direction at a predetermined interval by heavily doped n-type impurities. A field oxide film 53 is formed in the p-type semiconductor substrate 51 where the bit line 52 is formed in a direction perpendicular to the bit line 52 at a predetermined interval.

The bit line 52 corresponds to the source 35 and the drain 36 of the nonvolatile memory cell of FIG. 5A. Subsequently, a gate insulating film 54 is formed in an active region of the p-type semiconductor substrate 51, which is defined by the field oxide film 53. A floating gate 55b is formed over the gate insulating film 54. The floating gate 55b corresponds to the floating gate 31 of the nonvolatile memory cell of FIG. 5A. A word line 57a is formed on the floating gate 55b to be perpendicular to the bit line 52. A program line 62 is formed on the word line 57a in parallel with the bit line 52. The word line 57a corresponds to the control gate 33 of the nonvolatile memory cell of FIG. 5A. The program line 62 corresponds to the program gate 32 of the nonvolatile memory cell of FIG. 5A. Subsequently, a dielectric film 56 is formed between the floating gate 55b and the word line 57a. A tunneling oxide film 61 is formed at both sides of the floating gate 55b.

An oxide film 58 is formed on the word line 57a. An insulating film sidewall spacer 59 is formed at both sides of the word line 57a and the oxide film 58.

Meanwhile, as shown in FIG. 5C, the program line 62 is formed without affecting the cell size. That is, since the program line 62 is formed on the field oxide film 53 between the cells, the program line 62 does not change the cell size.

Also, programming can be performed by the tunneling oxide film 61 formed between the program line 62 and the floating gate 55b.

For example, in the operation of the nonvolatile memory cell having an n-channel region, electrons are implanted into the floating gate 31 from the program gate 32 by means of tunneling. Thus, it is desirable that a bias is applied to the cell for programming so that positive voltage is applied to the control gate 33 and a negative voltage is applied to the program gate 32 to generate tunneling.

Alternatively, a voltage of 0V may be applied to the program gate 32 and a positive voltage may be applied to the control gate 33.

In the nonvolatile memory cell of the present invention, programming can be performed by tunneling through the program gate 32. At the same time, monitoring for variation in the amount of charges in the floating gate 31 can be performed regardless of programming.

As described in detail, the positive voltage is applied to the control gate 33 and the negative voltage is applied to the program gate 32. At the same time, the bias is applied to the source 35 and the drain 36 to generate the drain current. The drain current is monitored by a sensing amplifier not shown).

At this time, the bias for programming should be applied to the cell for programming to turn on a channel at the beginning of programming.

As programming proceeds, the amount of charges in the floating gate 31 is varied. Such a variation is monitored by the field effect transistor consisting of the floating gate 31, the source 35 and the drain 36.

The nonvolatile memory cell of the present invention acts as a four-terminal floating gate field effect transistor during programming.

In the nonvolatile memory cell of the present invention, the current path for programming and the current path for monitoring are separated from each other. Thus, programming and monitoring are independently performed.

Conversely, the conventional nonvolatile memory cell acts as a three-terminal floating gate field effect transistor. In the conventional nonvolatile memory cell, the current path for programming and the current path for monitoring are not separated from each other. Thus, monitoring and programming are not independent from each other.

The conventional nonvolatile memory cell having a triple polysilicon gate also includes a floating gate, a control gate, and an erasing gate. Nonetheless, since the erasing gate of the conventional nonvolatile memory cell erases data for all of selected cells on the same condition, it is different from the program gate of the present invention, which performs only programming for the selected cells.

In other words, the program gate 32 of the present invention acts as a functional gate. The erasing gate of the conventional nonvolatile memory device is not regarded as the functional gate.

Figure 6:
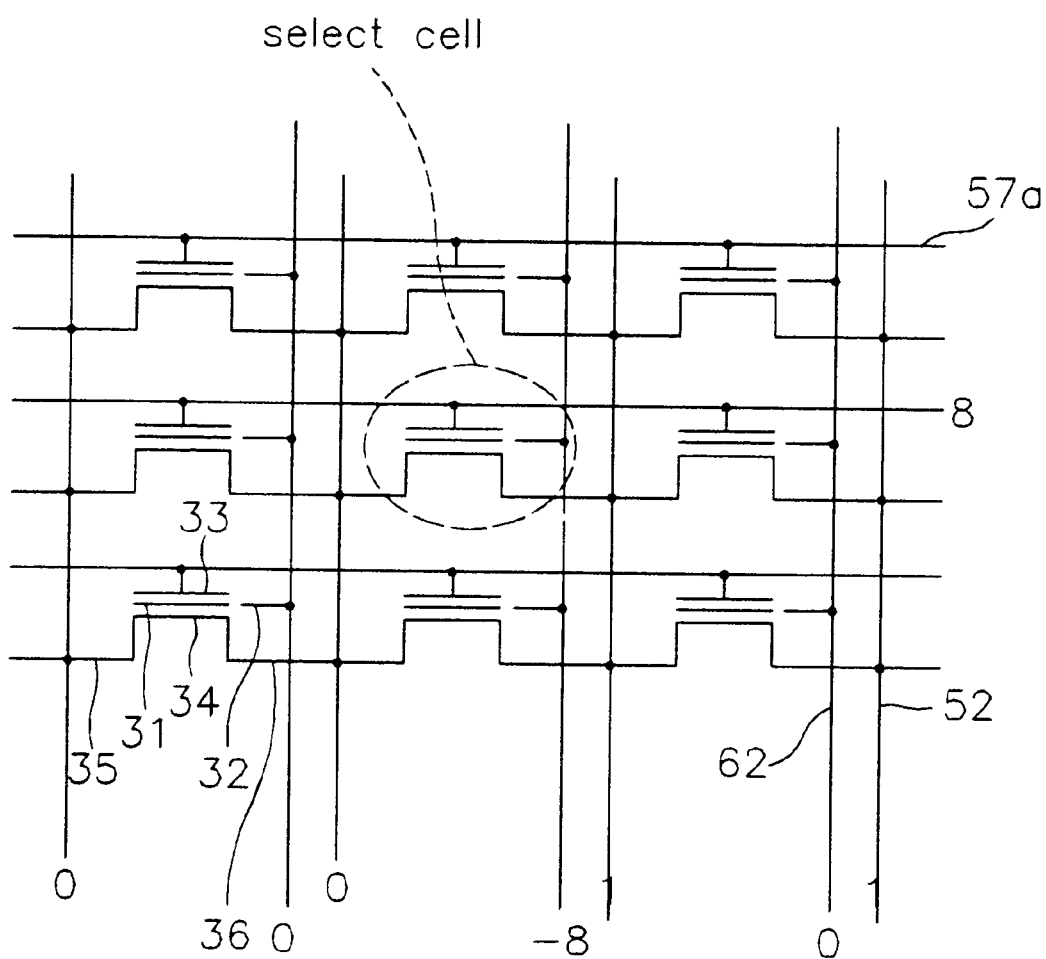
FIG. 6 is a circuit diagram illustrating a nonvolatile memory device according to the present invention.

FIG. 6 is a circuit illustrating a nonvolatile memory device according to the present invention. As shown in FIG. 6, the nonvolatile memory device includes a plurality of word lines 57a disposed on a semiconductor substrate (not shown) at a predetermined interval, a plurality of bit lines 52 disposed in a direction perpendicular to the word lines 57a to form a plurality of squares at a predetermined interval, a plurality of program lines 62 disposed in parallel with the bit lines 52, and a plurality of nonvolatile memory cells disposed one by one in the respective square.

In FIG. 6, respective nonvolatile memory cell includes a floating gate 31, a program gate 32 for providing charges to the floating gate 31, a control gate 33 for controlling the charges provided to the floating gate 31, a field effect transistor for reading (or monitoring) the charges provided to the floating gate 31 during programming.

The field effect transistor includes the floating gate 31, a source 35, a drain 36, and a channel region 34 disposed between the drain 36 and the source 35.

The control gate 33 of the respective nonvolatile memory cell is coupled to the adjacent word line 57a and the program gate 32 is coupled to the adjacent program line 62.

Furthermore, the source 35 of the nonvolatile memory cell in one square is coupled to the adjacent bit line 52 in common with the drain 36 of the nonvolatile memory cell on the next square.

As shown in FIG. 6, to simultaneously perform programming and monitoring, the selected cell requires selectivity for programming as well as selectivity for monitoring. Since the monitoring has the same function as reading, the selected cell requires selectivities for both programming and reading.

For selectivity for monitoring, a voltage for reading is applied to the word line 57a and the bit line 52 perpendicular to the word line 57a.

For example, a positive voltage of 8V is applied to the word line 57a, a sensing voltage of 1V is applied to the selected bit line 52, and a ground voltage of 0V is applied to the other bit line 52. The voltage of 1V, which is the same as the sensing voltage, is applied to at least one bit line 52 in a direction to which the sensing voltage of the selected bit line 52 is applied, so that the sensing current does not flow into non-selected cells.

For selectivity for programming, a bias voltage for programming is applied to the word line 57a and the program line 62 perpendicular to the word line 57a to generate tunneling.

For an n-channel cell, since electrons are implanted into the floating gate 31 from the program gate 32, a positive voltage of 8V is applied to the word line 57a and a negative voltage of 8V is applied to the program line 62.

To avoid the disturbance of the non-selected cells, a proper voltage may be applied to the non-selected word line 57a and the non-selected program line 62. This depends on tunneling and leakage current characteristic of the cell. The voltage applied to the word line 57a and the program line 62 should be distributed to turn on the cell at the beginning of programming. Such a condition can easily be achieved by designing the cell having a low capacitive coupling coefficient of the program gate 32. That is, as shown in the cross-sectional view of the cell of FIG. 5C, the program line 62 is formed on the field oxide film 53 between the respective cell and contacts the floating gate 55b in a contact area having a thickness as thin as the floating gate 55b.

Operation of the nonvolatile memory cell according to the present invention will be described.

The erasing operation is performed by the semiconductor substrate 51 or the program gate 32 through the gate insulating film 54 of the cell. When the erasing operation is performed by the semiconductor substrate 51, the gate insulating film 54 should be formed with a thickness of about 10 nm for tunneling. The negative voltage or the ground voltage is also applied to the control gate 33, and the positive voltage is applied to the semiconductor substrate 51.

When the erasing operation is performed by the program gate 32, the erasing should be performed with taking into consideration of a reliability of the tunneling oxide film 61 because programming and erasing are simultaneously performed through the program gate 32.

Referring to FIGS. 7 and 8A to 8D, the nonvolatile memory device of the present invention is described in overall. A plurality of bit lines 52 are formed in a p-type semiconductor substrate 51 in one direction at a predetermined interval. The respective bit line 52 has an n-type conductivity. Thus, the respective bit line 52 serves as an n-type impurity region and corresponds to the source 35 and drain 36 regions in the nonvolatile memory cell.

Subsequently, a plurality of word lines 57a are formed on the p-type semiconductor substrate 51 in a direction perpendicular to the bit lines 52 at a predetermined interval. A field oxide film 53 for field insulation is formed on the p-type semiconductor substrate 51 in a direction perpendicular to the bit lines 52 at a predetermined interval. A plurality of island shape floating gates 55b are formed over the p-type semiconductor substrate 51 between the respective field oxide film 53 in the bit lines 52. The gate insulating film 54 is formed between the p-type semiconductor substrate 51 and the floating gate 55b.

The respective word line 57a covers a plurality of floating gates 55b formed in a corresponding word line direction and corresponds to the control gate 33 in the nonvolatile memory cell.

A program line 62 is formed in parallel with the bit line 52 at a predetermined interval. The program line 62 covers a plurality of the floating gates 55b in a corresponding program line direction and corresponds to the program gate 32 in the nonvolatile memory cell.

Meanwhile, the respective bit line 52 and the floating gate 55b are insulated from each other by a dielectric film 56. An oxide film 58 is formed between the word line 57a and the program line 62 to insulate word line 57a and the program line from each other. A tunneling oxide film 61 is formed at both sides of the floating gate 55b in contact with the program line 62.

The program line 62 corresponds to the program gate 32, the word line 57a to the control gate 33, and the bit line 52 to the source 35 and the drain 36, respectively. The respective lines serve as gates.

Figure 7:
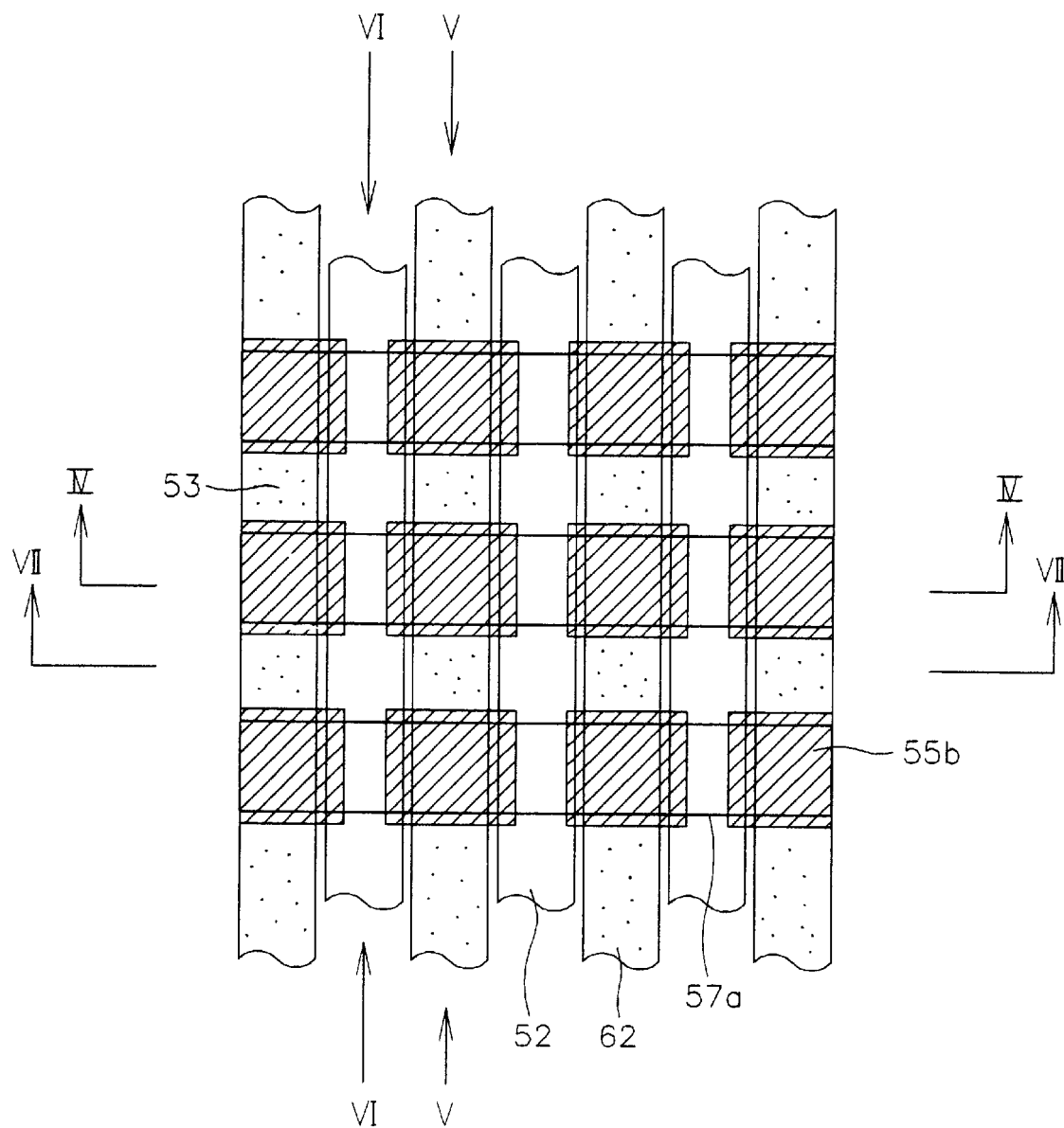
FIG. 7 is a layout illustrating a nonvolatile memory device according to the present invention.
Figure 8A:
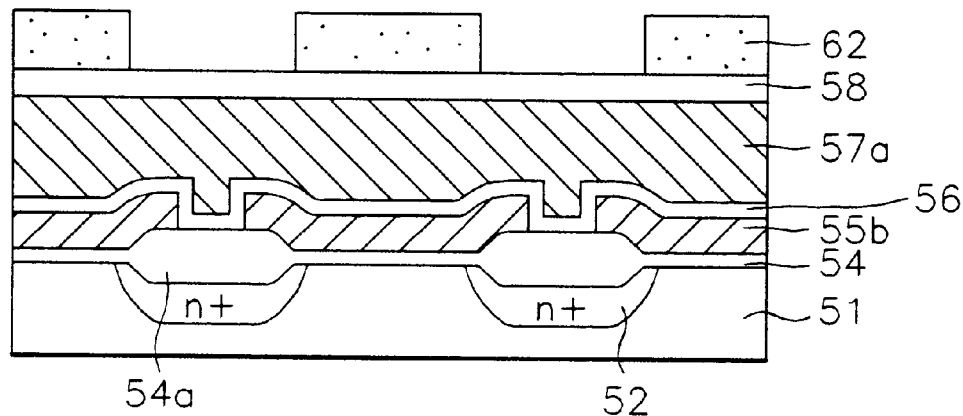
FIG. 8A is a cross-sectional view illustrating a nonvolatile memory device according to the present invention, taken along line IV—IV of FIG. 7.
Figure 8B:
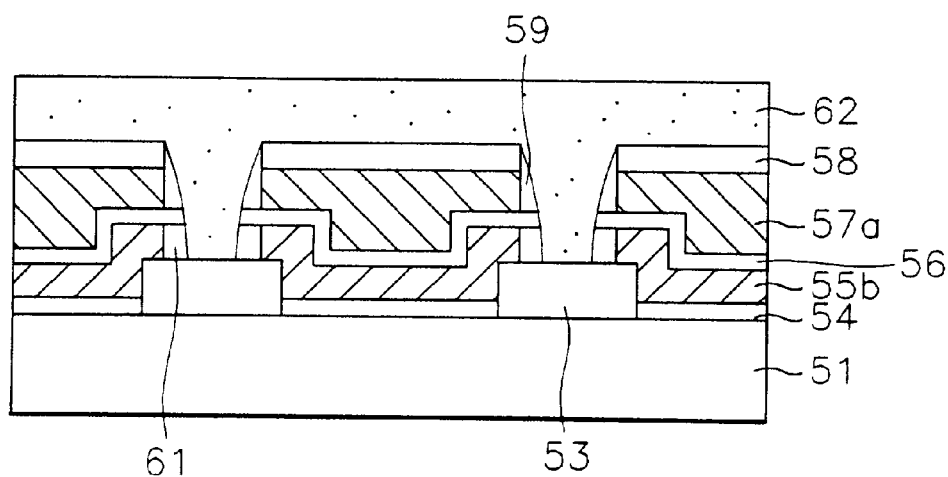
FIG. 8B is a cross-sectional view illustrating a nonvolatile memory device according to the present invention, taken along line V—V of FIG. 7.
Figure 8C:
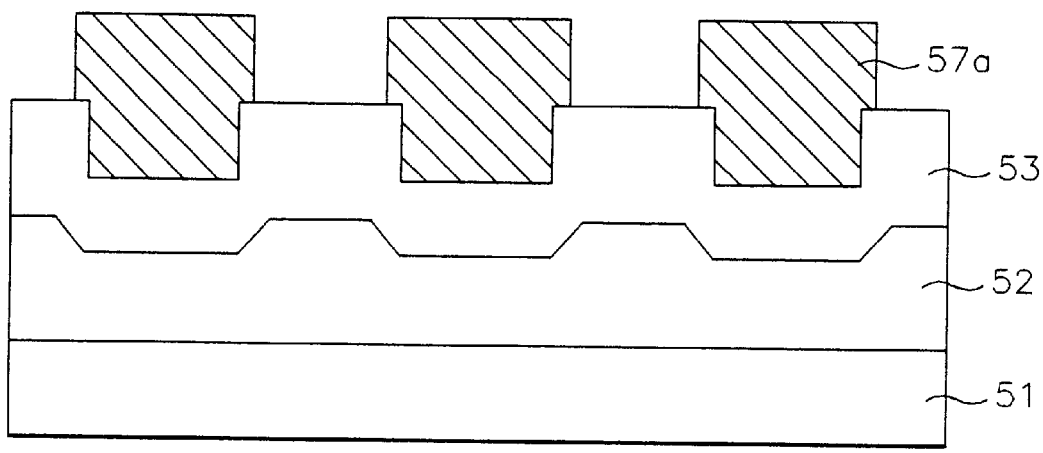
FIG. 8C is a cross-sectional view illustrating a nonvolatile memory device according to the present invention, taken along line VI—VI of FIG. 7.
Figure 8D:
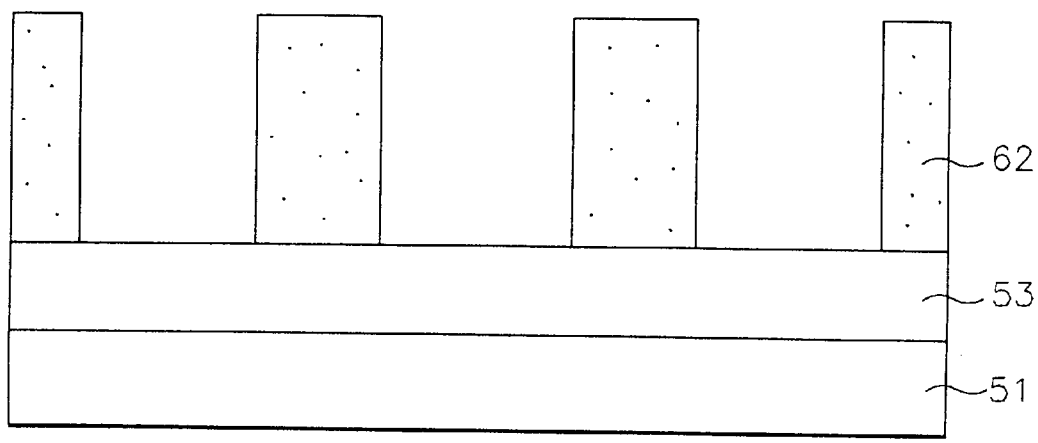
FIG. 8D is a cross-sectional view illustrating a nonvolatile memory device according to the present invention, taken along line VII—VII of FIG. 7.

FIGS. 9A to 9G are cross-sectional views illustrating a method of fabricating a nonvolatile memory device according to the present invention, taken along IV—IV line of FIG. 7. FIGS. 10A to 10G are cross-sectional views illustrating a method of fabricating a nonvolatile memory device according to the present invention, taken along V—V line of FIG. 7.

Figure 9A:
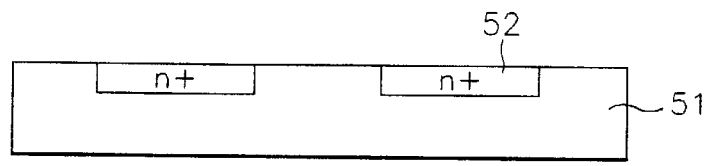
FIGS. 9A to 9G are cross-sectional views illustrating a method of fabricating a nonvolatile memory device according to the present invention, taken along line IV—IV of FIG. 7.
Figure 10A:
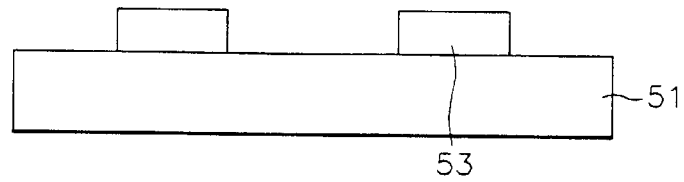
FIGS. 10A to 10G are cross-sectional views illustrating a method of fabricating a nonvolatile memory device according to the present invention, taken along line V—V of FIG. 7.

As shown in FIG. 9A and FIG. 10A, a photoresist (not shown) is deposited on the p-type semiconductor substrate 51 and patterned by exposure and developing processes. Heavily doped n-type impurity ions are implanted into the p-type semiconductor substrate 51 using the patterned photoresist as a mask to form a plurality of bit lines 52 including n-type impurity diffusion regions.

In this process, the cell size may be increased due to a lateral diffusion of the implanted n-type impurity ions into the p-type semiconductor substrate 51. In order to solve this problem, a high temperature low deposition (HLD) spacer is formed at both sides of the patterned photoresist. The n-type impurity ions are implanted into the p-type semiconductor substrate 51 using the photoresist and the HLD spacer as masks to form the bit lines 52.

A plurality of field oxide films 53 are formed in a field isolation region in a direction perpendicular to the bit lines 52 for isolation between the respective cell.

The field oxide films 53 may be formed by chemical vapor deposition (CVD) or local oxidation of silicon (LOCOS). A channel region is formed between the respective field oxide film 53, which serves as an active region.

An insulating sidewall spacer may be formed at both sides of the field oxide film 53 to facilitate a dry etching process for polysilicon which will be performed later.

Figure 9B:
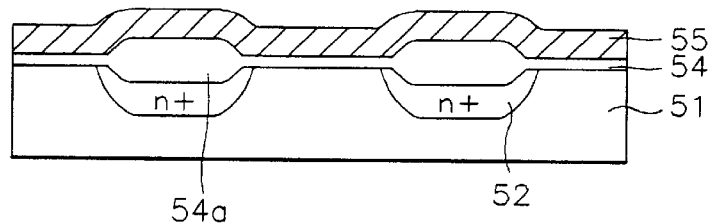
Figure 10B:
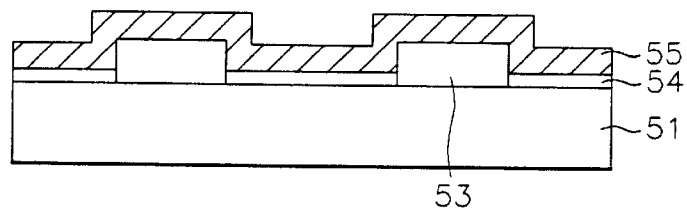

As shown in FIG. 9B and FIG. 10B, a gate insulating film 54 is formed in an active region of the p-type semiconductor substrate 51 by thermal oxidation. The active region is defined by the field oxide film 53. In this process, for sufficient etching barrier during the etching process for polysilicon in the later process, a thermal oxide film 54a is formed in the bit line 52 having a thickness greater than other portions.

Subsequently, a first polysilicon 55 for forming the floating gate is deposited on the entire surface of the p-type semiconductor substrate 51 including the gate insulating film 54.

At this time, the first polysilicon 55 completely covers the channel region.

Figure 9C:
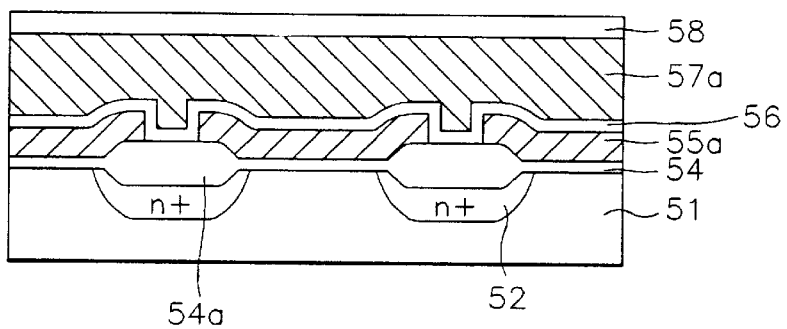
Figure 10C:
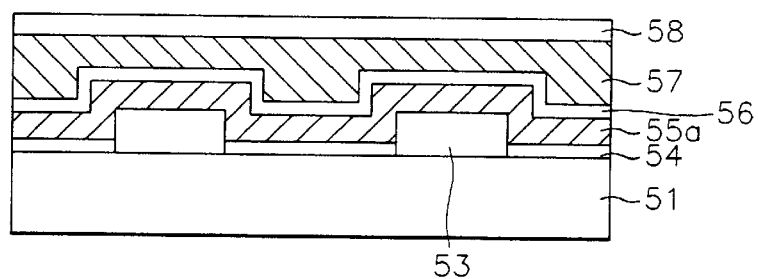

As shown in FIG. 9C and FIG. 10C, the first polysilicon 55 is selectively removed to form a plurality of floating lines 55a. A dielectric film 56 such as oxide or oxide/nitride/oxide (ONO) is formed on the entire surface of the p-type semiconductor substrate 51 including the floating line 55a. The floating line 55a is formed in a direction the same as the bit line 52.

Subsequently, a second polysilicon 57 for forming the word line is formed on the entire surface of the p-type semiconductor substrate 51 including the dielectric film 56. An oxide film 58 is formed on the second polysilicon 57.

Figure 9D:
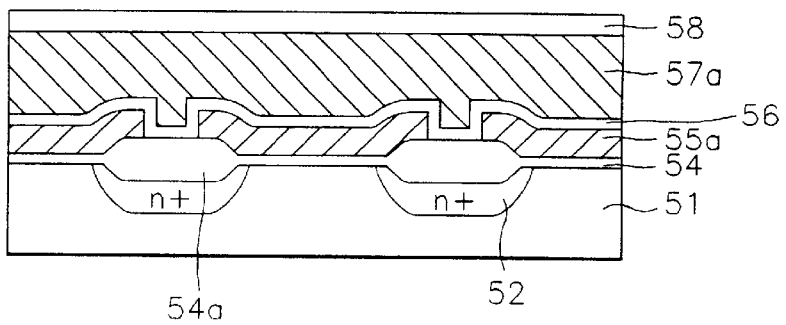
Figure 10D:
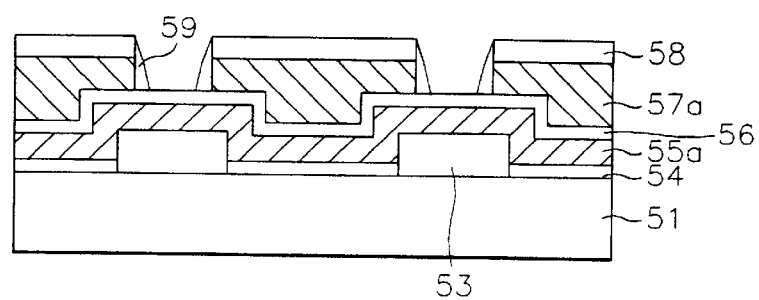

As shown in FIG. 9D and FIG. 10D, a photoresist (not shown) is deposited on the oxide film 58 and patterned by exposure and developing processes. The oxide film 58 is selectively removed using the patterned photoresist as a mask. The second polysilicon 58 is then selectively removed using the patterned photoresist as a mask to form a plurality of word lines 57a between the respective field oxide film 53. The word lines 57a are formed in a direction perpendicular to the bit lines 52.

Subsequently, an insulating film is formed on the entire surface of the p-type semiconductor substrate 51 including the oxide film 58. An insulating film sidewall spacer 59 is formed at both sides of the oxide film 58 and the word line 57a by an etch-back process.

Figure 9E:
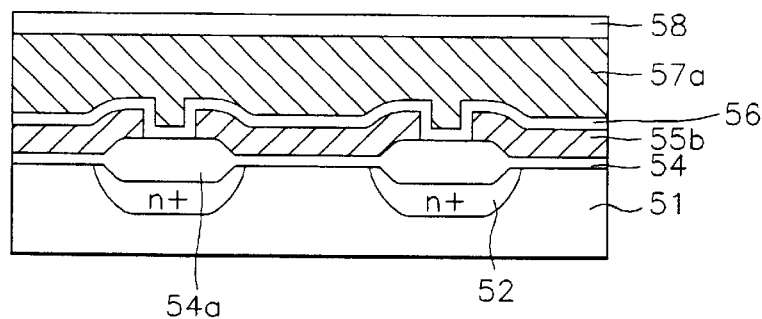
Figure 10E:
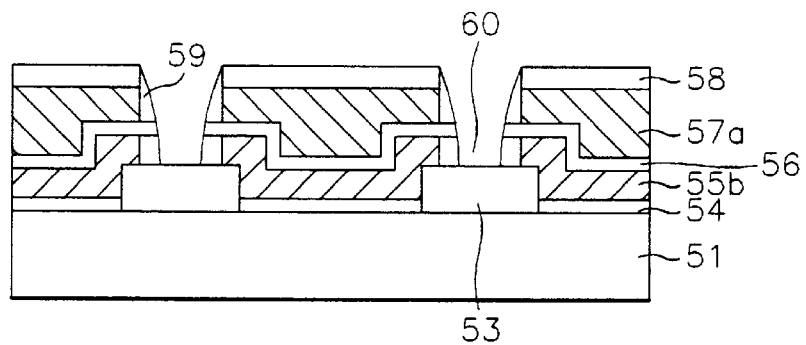

As shown in FIG. 9E and FIG. 10E, the dielectric film 56 and the floating line 55a are selectively removed using the oxide film 58 and the insulating film sidewall spacer 59 as masks to partially expose the field oxide film 53. As a result, a contact hole 60 is formed. At this time, the floating lines 55a are selectively removed to form a plurality of floating gates 55b.

Figure 9F:
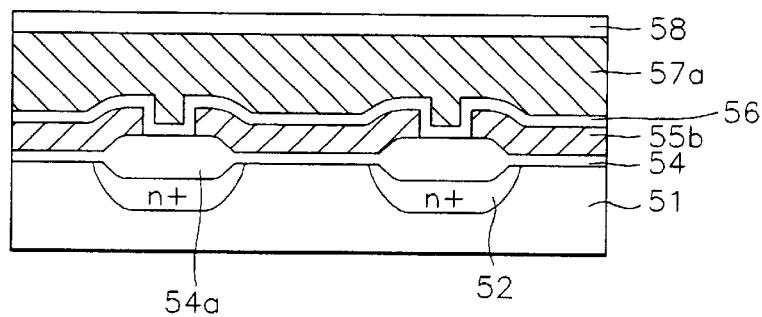
Figure 10F:
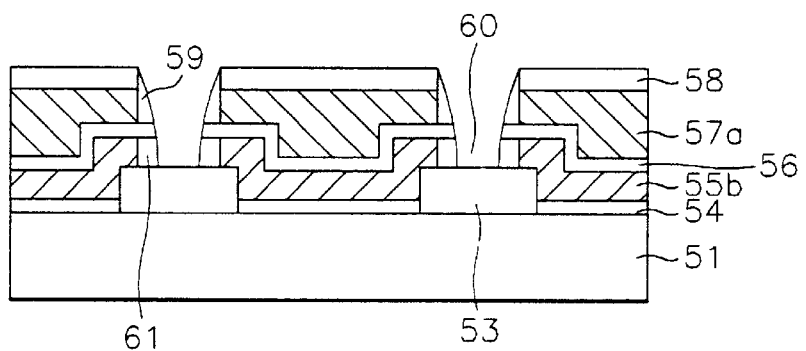

As shown in FIGS. 9F and 10F, thermal oxidation is performed using the oxide film 58 and the insulating film sidewall spacer 59 as masks to form a tunneling oxide film 61 at both sides of the floating gate 55b.

Alternatively, the tunneling oxide film 61 may be formed by CVD and etch-back process instead of a thermal oxidation process. The tunneling oxide film 61 thus may be formed by forming a CVD oxide film on the entire surface of the semiconductor substrate including the floating gate, and subsequently forming a sidewall spacer at both sides of the floating gate by etch-back process.

Figure 9G:
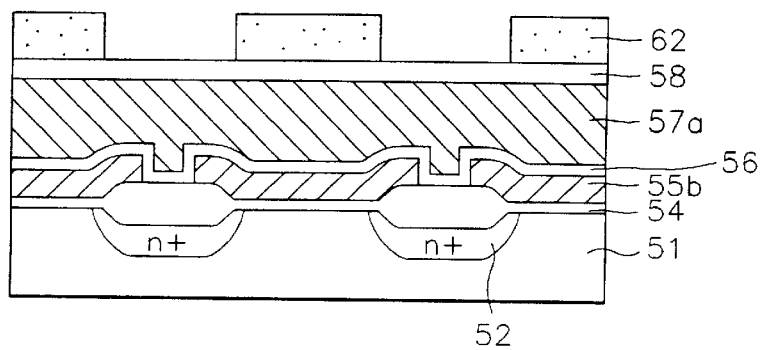
Figure 10G:
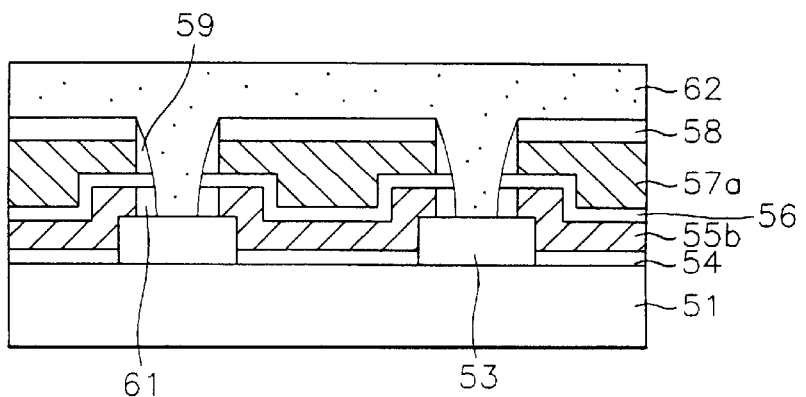

As shown in FIGS. 9G and FIG. 10G, a third polysilicon for forming a program line is deposited on the entire surface of the p-type semiconductor substrate 51 including the contact hole 60. The third polysilicon is then selectively removed to form a plurality of program lines 62 in the contact hole 60 and on the insulating film 58 adjacent to the contact hole 60. The program lines 62 are formed over the field oxide film 53 in parallel with the bit line 52.

In this process the program lines 62 are formed to overlap the tunneling oxide film 61 and are formed one by one in the bit line 52 (i.e., per cell). Also, the program lines 62 are in turn connected to the tunneling region on the field oxide film 53 to reduce a programming coupling.

As aforementioned, the method of fabricating the non-volatile memory device of the present invention has an advantage that a nonvolatile memory cell having a minimum effective cell size can be achieved by array without metal contact.

It will be apparent to those skilled in the art that various modifications and variations can be made in the method of fabricating a nonvolatile memory device according to the present invention without departing from the spirit or scope of the invention. Thus, it is intended that the present invention cover the modifications and variations of the invention provided they come within the scope of the appended claims and their equivalents.

What is claimed is:

1. A method of fabricating a nonvolatile memory device having a substrate, the method comprising the steps of:

forming a plurality of bit lines in the substrate;

forming a plurality of field oxide layers on the substrate substantially perpendicular to the bit lines;

forming a gate insulating layer over a surface of the substrate including the bit lines;

forming a plurality of floating lines on the gate insulating layer between the bit lines;

forming a dielectric layer over the surface of the semiconductor substrate including the floating lines and the gate insulating layer;

forming a plurality of word lines between the field oxide layers substantially perpendicular to the bit lines;

forming a sidewall spacer at both sides of the word lines;

selectively removing the dielectric layer and the floating lines using the word lines and the sidewall spacer as masks to form a plurality of floating gates;

forming a tunneling layer at both sides of the floating gates; and forming a plurality of program lines between each of the adjacent bit lines.

2. The method of fabricating a nonvolatile memory device according to claim 1, wherein the bit lines are formed by implanting n-type impurity ions into the substrate.

3. The method of fabricating a nonvolatile memory device according to claim 1, wherein the step of forming a plurality of bit lines includes the steps of:

forming a photoresist layer to define a bit line region on the substrate;

forming a dielectric spacer at both sides of the photoresist layer; and implanting impurities into the substrate using the photoresist layer and the dielectric spacer as masks.

4. The method of fabricating a nonvolatile memory device according to claim 1, wherein the gate insulating layer is formed by thermal oxidation.

5. The method of fabricating a nonvolatile memory device according to claim 1, wherein the gate insulating layer is formed to have first and second portions on the bit lines, the first portion being thicker than the second portion.

6. The method of fabricating a nonvolatile memory device according to claim 1, wherein the tunneling layer is formed by thermal oxidation.

7. The method of fabricating a nonvolatile memory device according to claim 1, wherein the tunneling layer is formed of an oxide layer.

8. The method of fabricating a nonvolatile memory device according to claim 1, wherein the tunneling layer is formed by chemical vapor deposition.

9. The method of fabricating a nonvolatile memory device according to claim 1, wherein the program lines are sequentially formed between the bit lines.

10. The method of fabricating a nonvolatile memory device according to claim 1, wherein the program lines are formed to contact the tunneling layer.

11. The method of fabricating a nonvolatile memory device according to claim 1, wherein the dielectric layer is formed of oxide or oxide/nitride/oxide (ONO).

12. The method of fabricating nonvolatile memory device according to claim 1, wherein the step of forming a plurality of word lines includes:

forming a conductive layer on the dielectric layer;

forming an insulating layer on the conductive layer; and selectively removing the conductive layer and the insulating layer to form a plurality of word lines.

13. The method of fabricating nonvolatile memory device according to claim 1, wherein the floating lines are formed to have a direction substantially parallel with the bit lines.

14. The method of fabricating nonvolatile memory device according to claim 1, wherein the program lines are formed to contact the tunneling layer.

15. The method of fabricating nonvolatile memory device according to claim 1, wherein the field oxide layers are formed by a chemical vapor deposition (CVD) or local oxidation of silicon (LOCOS) process.

16. The method of fabricating nonvolatile memory device according to claim 1, wherein the word lines are formed of polysilicon.

17. The method of fabricating nonvolatile memory device according to claim 1, wherein the step of forming a tunneling layer includes:

forming an oxide layer on the field oxide layer; and performing an etch-back process on the oxide layer.

18. The method fabricating nonvolatile memory device according to claim 17, wherein the oxide layer is formed by chemical vapor deposition or thermal oxidation.

19. A method of fabricating a nonvolatile memory device having a substrate, the method comprising the steps of:

forming a mask layer to define a bit line region on the substrate;

forming a dielectric spacer at both sides of the mask layer;

implanting impurities into the substrate using the mask layer and the dielectric spacer as masks to form a plurality of bit lines;

forming a plurality of field oxide layers on the substrate substantially perpendicular to the bit lines;

forming a gate insulating layer on a surface of the substrate including the bit lines;

forming a plurality of floating lines on the gate insulating layer between each of the bit lines;

forming a dielectric layer on the surface of the semiconductor substrate including the floating lines and the gate insulating layer;

forming a conductive layer on the dielectric layer;

forming an insulating layer on the conductive layer;

selectively removing the conductive layer and the insulating layer to form a plurality of word lines;

forming a sidewall spacer at both sides of the word lines;

selectively removing the dielectric layer and the floating lines using the word lines and the sidewall spacer as masks to form a plurality of floating gates;

forming an oxide layer on the field oxide layer;

performing an etch-back process on the oxide layer; and forming a plurality of program lines between each of the adjacent bit lines.

20. The method of fabricating a nonvolatile memory device according to claim 19, wherein the bit lines are formed by implanting n-type impurity ions into the substrate.

21. The method of fabricating a nonvolatile memory device according to claim 19, wherein the gate insulating layer is formed by thermal oxidation.

22. The method of fabricating a nonvolatile memory device according to claim 19, wherein the gate insulating layer is formed to have first and second portions on the bit lines, the first portion being thicker than the second portion.

23. The method of fabricating a nonvolatile memory device according to claim 19, wherein the oxide layer is formed by thermal oxidation.

24. The method of fabricating a nonvolatile memory device according to claim 19, wherein the oxide layer is formed by chemical vapor deposition.

25. The method of fabricating a nonvolatile memory device according to claim 19, wherein the program lines are sequentially formed between the bit lines.

26. The method of fabricating a nonvolatile memory device according to claim 19, wherein the dielectric layer is formed of oxide or oxide/nitride/oxide (ONO).

27. The method of fabricating nonvolatile memory device according to claim 19, wherein the word lines are formed between the field oxide layer substantially perpendicular to the bit lines.

28. The method of fabricating nonvolatile memory device according to claim 19, wherein the floating lines are formed to have a direction substantially parallel with the bit lines.

29. The method of fabricating nonvolatile memory device according to claim 19, wherein the program lines are formed to contact the oxide layer.

30. The method of fabricating nonvolatile memory device according to claim 19, wherein the field oxide layers are formed by a chemical vapor deposition (CVD) or local oxidation of silicon (LOCOS) process.

31. The method of fabricating nonvolatile memory device according to claim 19, wherein the word lines are formed of polysilicon.

32. The method of fabricating nonvolatile memory device according to claim 19, wherein the oxide layer is formed at both sides of the floating gates.

33. The method fabricating nonvolatile memory device according to claim 19, wherein the oxide layer is formed by chemical vapor deposition or thermal oxidation.

* * * * *